(12) United States Patent
Lee

(10) Patent No.: US 10,690,787 B2
(45) Date of Patent: *Jun. 23, 2020

(54) RADIATION IMAGING SYSTEM

(71) Applicant: VIEWORKS CO., LTD., Anyang-si, Gyeonggi-do (KR)

(72) Inventor: Denny Lap Yen Lee, West Chester, PA (US)

(73) Assignee: VIEWORKS CO., LTD., Anyang-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/456,145

(22) Filed: Jun. 28, 2019

(65) Prior Publication Data

US 2020/0018864 A1 Jan. 16, 2020

Related U.S. Application Data

(63) Continuation-in-part of application No. 16/036,856, filed on Jul. 16, 2018.

(51) Int. Cl.
| | | |
|---|---|---|
| *G01T 1/24* | (2006.01) | |
| *G01T 1/20* | (2006.01) | |
| *G01T 1/29* | (2006.01) | |
| *H01L 27/146* | (2006.01) | |
| *H01L 31/115* | (2006.01) | |

(52) U.S. Cl.
CPC ............ *G01T 1/24* (2013.01); *G01T 1/20* (2013.01); *G01T 1/2928* (2013.01); *H01L 27/14676* (2013.01); *H01L 31/115* (2013.01)

(58) Field of Classification Search
CPC ................................................ G01T 1/24; G01T 1/2928; G01T 1/20; H01L 27/14676; H01L 31/115

USPC .................................................... 250/370.09
See application file for complete search history.

(56) References Cited

U.S. PATENT DOCUMENTS

| | | | |
|---|---|---|---|
| 5,262,649 A | 11/1993 | Antonuk et al. | |
| 5,319,206 A | 6/1994 | Lee et al. | |
| 2001/0006545 A1 | 7/2001 | Kim | |
| 2004/0251421 A1* | 12/2004 | Kobayashi | ........ H01L 27/14659 250/370.09 |
| 2005/0024581 A1 | 2/2005 | Kim et al. | |
| 2005/0206764 A1* | 9/2005 | Kobayashi | ........ H01L 27/14659 348/308 |
| 2009/0026383 A1* | 1/2009 | Kim | ............... H01L 27/14676 250/370.11 |

(Continued)

FOREIGN PATENT DOCUMENTS

| | | |
|---|---|---|
| EP | 0 602 475 A2 | 6/1994 |
| EP | 1 246 250 A2 | 10/2002 |
| JP | 2015-005533 A | 1/2015 |

OTHER PUBLICATIONS

Extended European Search Report dated Jan. 3, 2020.

*Primary Examiner* — David P Porta
*Assistant Examiner* — Gisselle M Gutierrez
(74) *Attorney, Agent, or Firm* — Rabin & Berdo, P.C.

(57) ABSTRACT

A radiation imaging system includes a radiation-emitting device and a radiation imaging device. The radiation imaging device has an electrical insulation layer having a top surface and a bottom surface, a top electrode on the top surface of the electrical insulation layer, an array of pixel units electrically coupled to the electrical insulation layer, and an array of transistors connected to the array of pixel units.

30 Claims, 10 Drawing Sheets

(56) References Cited

U.S. PATENT DOCUMENTS

| | | |
|---|---|---|
| 2010/0051820 A1 | 3/2010 | Okada |
| 2011/0241143 A1* | 10/2011 | Kim .................. G01T 1/242 |
| | | 257/428 |
| 2012/0038013 A1 | 2/2012 | Karim et al. |
| 2013/0009069 A1 | 1/2013 | Okada |
| 2014/0084282 A1* | 3/2014 | Cao .................. H01L 29/7869 |
| | | 257/43 |
| 2014/0117246 A1 | 5/2014 | Zhou et al. |
| 2015/0303245 A1 | 10/2015 | Kashiwabara et al. |
| 2016/0172429 A1 | 6/2016 | Kondoh et al. |
| 2016/0315130 A1 | 10/2016 | Kajiyama et al. |
| 2017/0005155 A1 | 1/2017 | You et al. |
| 2017/0221230 A1* | 8/2017 | Allinson .............. A61B 6/032 |
| 2017/0365635 A1 | 12/2017 | Yang |
| 2018/0083079 A1 | 3/2018 | Kajiyama et al. |

\* cited by examiner

FIG. 5
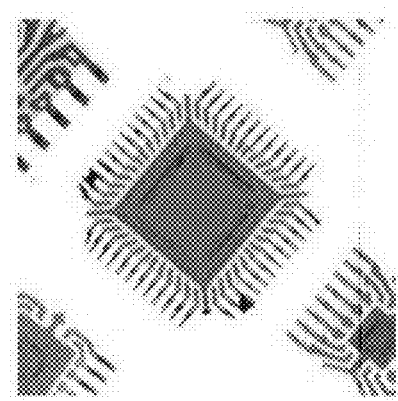
(A)
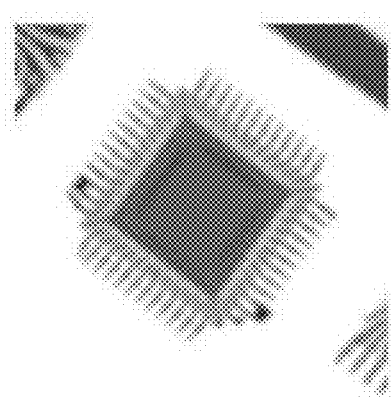
(B)
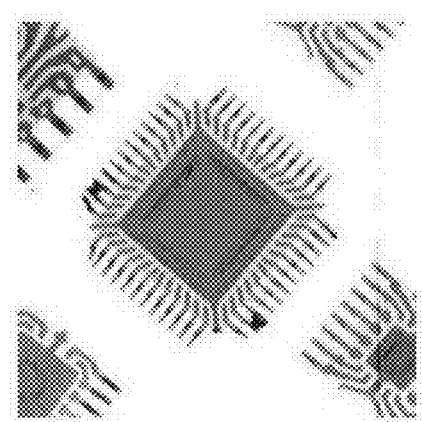
(C)
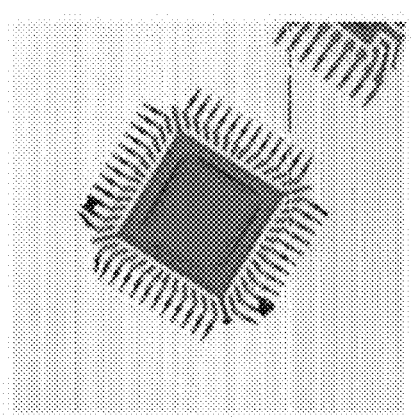
(D)

RADIATION IMAGING SYSTEM

FIELD OF THE INVENTION

The present invention relates to a radiation imaging system. More particularly, the present invention relates to a radiation imaging system using electrical insulation material under an applied electric field.

BACKGROUND

Radiograms have been produced by using layers of radiation sensitive materials to directly capture radiographic images as image-wise modulated patterns of electrical charges. Depending on the intensity of the incident X-ray radiation, electrical charges generated either electrically or optically by the X-ray radiation within a pixelized area are quantized using a regularly arranged array of discrete solid-state radiation sensors.

U.S. Pat. No. 5,319,206 describes a system employing a layer of photoconductive material to create an image-wise modulated areal distribution of electron-hole pairs which are subsequently converted to corresponding analog pixel (picture element) values by electro-sensitive devices, such as thin-film transistors. U.S. Pat. No. 5,262,649 describes a system employing a layer of phosphor or scintillation material to create an image-wise modulated distribution of photons which are subsequently converted to a corresponding image-wise modulated distribution of electrical charges by photosensitive devices, such as amorphous silicon photodiodes. These solid-state systems have the advantage of being useful for repeated exposures to X-ray radiation without consumption and chemical processing of silver halide films.

In systems utilizing a photoconductive material such as selenium such as the prior art, a conventional radiation imaging system 100 shown in FIG. 1, before exposure to image-wise modulated X-ray radiation, an electrical potential is applied to the top electrode 110 to provide an appropriate electric field. During exposure to X-ray radiation, electron-hole pairs are generated in the photoconductive layer 190, under the dielectric layer 120, in response to the intensity of the image-wise modulated pattern of X-ray radiation, and these electron-hole pairs are separated by the applied biasing electric field supplied by a high voltage power supply. The electron-hole pairs move in opposite directions along the electric field lines toward opposing surfaces of the photoconductive layer 190. After the X-ray radiation exposure, a charge image is received at the charge-collection electrode 130 and stored in the storage capacitor 160 of the transistor 150, which is formed on the substrate 170. This image charge is then readout by an orthogonal array of thin film transistors and the charge integrating amplifier 140. This type of direct conversion system has the distinct advantage of maintaining high spatial resolution more or less independent with the thickness of the x-ray converting photoconductive layer. However, currently, only a very limited number of direct converting photoconductors can be used for commercial products.

The most popular and technical matured material is amorphous selenium that has good charge transport properties for both holes and electrons generated by the x-ray. However, selenium having an atomic number of 34 has only good x-ray absorption in the low energy range, typically below 50 KeV. The absorption coefficient of selenium at higher energy x-ray is smaller and therefore thicker selenium layer is required for adequate x-ray capture. Since the complication and difficulty of fabrication of good imaging quality amorphous selenium is a strong function of the selenium thickness, successful x-ray imaging products are limited to lower energy x-ray applications such as mammography, low energy x-ray crystallography, and low energy non-destructive testing.

For high energy or high intensity x-ray applications, a large number of electron hole-pairs can be generated from each absorbed x-ray photon. When the electrons and holes move along the electric field to the charge collecting electrodes or to the bias electrode, a significant number of electrons and/or holes can be trapped in the selenium layer. These trapped charges will alter the local electric field, and therefore the subsequent charge transport and charge generation efficiency, resulting in a shadow of the previous image superimposed on the subsequent image in a phenomenon known as "ghosting". Certain image erasing processes are in general required to remove these charges and to restore the selenium layer to uniform charge conversion properties.

After exposure to a first x-ray, selenium experiences charge trapping, and therefore, it suffers from the ghosting effect. Due to these unwanted results, an era se process is needed to reduce the ghosting. K-band radiation from amorphous selenium can also deteriorate image resolution. Consequently, systems utilizing a photoconductive material between a dielectric layer 120 and a charge-collection electrode 130, such as the prior art shown in FIG. 1, are unable to generate high-quality (e.g. high-resolution) images at high energy ranges of x-rays, such as in the 100 keV-MeV range. In fact, such prior art devices are typically only able to generate high-resolution images in a range up to tens of keVs, such as below 50 keV.

It is therefore desirable to design a radiation imaging system without loss of resolution, and with minimized ghosting in high radiation energy or high dose.

During radiation therapy using charged particles, the patient is in a high-background radiation room (there are significant background x-rays and gamma rays). In such an environment, it is desirable to have a detector that has high detection efficiency for charged particles and low detection efficiency for x-rays or gamma rays.

One method of radiation therapy is proton therapy, in which a beam of high energy protons is directed to a patient. One advantage of proton therapy in providing treatment is that protons deposit the majority of their ionization dose at a particular location in the body and then travel no further through the body. This effect results in less damage to tissue surrounding a target. However, since the proton beam does not travel through the body, in proton therapy, the proton cannot be detected after passing through the patient, and it has been difficult to accurately detect the energy of the proton beam.

There is presently a need for doctors to know whether a proton beam is radiated to a desired location for treatment and whether the intensity of the proton beam is at a desired level.

Conventionally, the detection or measurement of the proton beam being used to treat the patient has not been possible. Instead, a separate proton beam (test beam) is irradiated against a detector, and the location and intensity of the beam are detected. A separate proton beam (treatment beam) is irradiated against the patient for treatment.

FIG. 6 provides an example of such a system. As shown in FIG. 6, the conventional proton beam therapy system 600 includes a scintillation panel 601, a camera 602 and a mirror 603 to direct scintillation (photons) from the scintillation panel 601 to the camera.

After a position and intensity are detected by the system 600, the system 600 may be moved and a treatment beam may be irradiated against a patient. In the alternative, the simulated beam may be generated in parallel with a treatment beam. In either case, it is impossible to have real time detection of the position and intensity of the treatment beam, or "inline dosimetry." Consequently, there may be differences between the position and intensity of the simulated beam and the treatment beam, and treatment effectiveness may be less effective.

SUMMARY OF THE INVENTION

A radiation imaging device according to an embodiment of the invention has an electrical insulation layer with a top surface and a bottom surface, a top electrode on the top surface of the electrical insulation layer, an array of pixel units electrically coupled to the electrical insulation layer and in direct contact with the bottom surface of the electrical insulation layer, and an array of transistors connected to the array of pixel units is provided.

In an aspect of the present invention, a radiation imaging system is provided having a radiation emission device and a radiation imaging device which includes an electrical insulation layer with a top surface and a bottom surface, a top electrode on the top surface of the electrical insulation layer, an array of pixel units electrically coupled to the electrical insulation layer and in direct contact with the bottom surface of the electrical insulation layer, and an array of transistors connected to the array of pixel units. Each of the plurality of pixel units comprises a charge collection electrode disposed at the bottom surface of the electrical insulation layer. Each of the plurality of pixel units further comprises a charge storage capacitor and at least one transistor.

The plurality of pixel units are electrically coupled to the electrical insulation layer without an x-ray semiconductor. The transistor is coupled between the charge collection electrode and a charge-integrating amplifier.

In another aspect of the present invention, a method of operating a radiation imaging system having an electrical insulation layer with a top surface and a bottom surface, a top electrode on the top surface of the electrical insulation layer, an array of pixel units electrically coupled to the electrical insulation layer and in direct contact with the bottom surface the electrical insulation layer, and a transistor connected to each of the plurality of pixel units is provided. The method includes applying a bias voltage to the top electrode, receiving a charged particle beam, wherein the charged particle beam penetrates the electrical insulation layer and generates a charge signal, storing the charge signal in a storage capacitor, such that a plurality of charge signals is stored in a plurality of storage capacitors. The method further includes changing a polarity of a gate line bias voltage of one row of transistors and integrating charges from orthogonal data lines, each connected to a respective storage capacitor among the plurality of storage capacitors.

It is therefore an object, aspect and advantage of the present invention to provide a radiation imaging system having an electrical insulation layer with a top surface and a bottom surface, a top electrode on the top surface of the electrical insulation layer, an array of pixel units electrically coupled to the electrical insulation layer without an x-ray semiconductor, and an array of transistors connected to the array of pixel units.

Further objects, aspects and advantages of the present invention will become apparent by reference to the following description and appended drawings wherein like reference numbers refer to the same component, element or feature.

BRIEF DESCRIPTION OF THE DRAWINGS

Features of the present invention will become apparent to those skilled in the art from the following description with reference to the figures, in which:

FIG. 5 shows comparison of x-ray images obtained from the radiation imaging system 200, according to an embodiment of the present invention, and x-ray images obtained from conventional radiation imaging systems

DETAILED DESCRIPTION

For simplicity and illustrative purposes, the present invention is described by referring mainly to exemplary embodiments thereof. In the following description, numerous specific details are set forth to provide a thorough understanding of the present invention. However, it will be apparent to one of ordinary skill in the art that the present invention may be practiced without limitation to these specific details. In other instances, well known methods and structures have not been described in detail to avoid unnecessarily obscuring the present invention.

Embodiments of the present invention provide a radiation imaging system and a method for operating the radiation imaging system. Details of the present disclosure will be explained in more detail with reference to the following examples. Embodiments that are not included herein will be readily recognized and appreciated by those skilled in the art, and an explanation thereof is omitted.

The radiation may be at least one selected from X-ray, gamma-ray, and ionization radiation. The ionization radiation may include all radiation that penetrates material and produces light in scintillation material. For example, the ionization radiation may include alpha-ray, beta-ray, proton beam, charged particle beam, neutron and the like.

Figure 2:
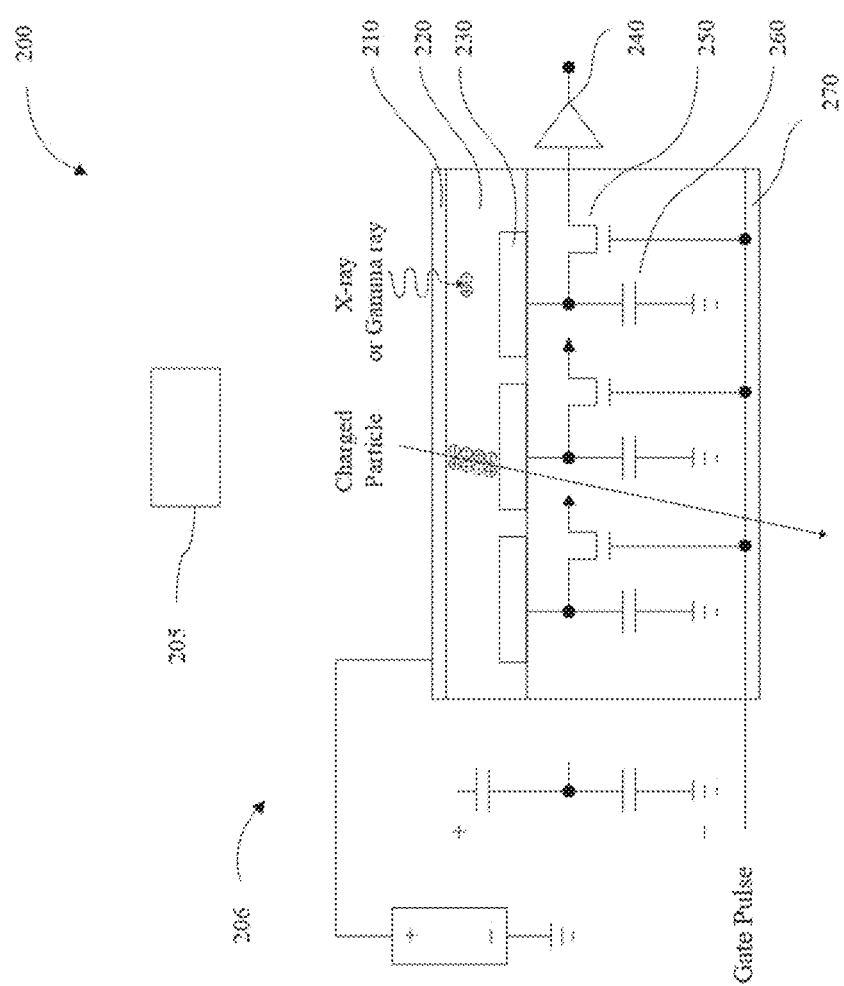
FIG. 2 illustrates a schematic view of a radiation imaging system, according to an embodiment of the present invention.

FIG. 2 is a schematic view illustrating a radiation imaging system 200 according to an embodiment of the present invention. The radiation imaging system 200 includes a radiation-emission device 205 and a radiation imaging device 206. An embodiment is described below in connection with charged particle radiation. Examples of charged particle radiation, including ion beam radiation. Examples of charged particle radiation or ion beam radiation include proton beam radiation, helium ion beam, carbon ion beam, heavy ion beam, electron beam, muon beam, pion beam, etc. The radiation imaging device 206 includes a top electrode 210, an electrical insulation layer 220, and a charge collection electrode 230. The radiation imaging system 200 further includes a charge-integrating amplifier 240, a transistor 250, and a storage capacitor 260. The top electrode 210 may be formed by sputtering deposition and/or adhesion and may be formed of any conductive material, such as metal. Examples of the electrical insulation layer 220 include, but not limited to, organic compounds which comprises low Z materials (e.g. chemical elements with low atomic numbers of protons in the nucleus) such as hydrogen (H), oxygen (O), carbon (C), nitrogen (N), and fluoride (F), such as polytetrafluoroethylene (TEFLON) and acrylic resins. Preferred examples of materials for the electrical insulation layer 220 are parylene, BCB (Benzocyclobutene), and polyimide film (KAPTON), which have high dielectric strength. Vacuum deposition can be used for parylene and adhesion can be used for either parylene or KAPTON by preparing film tape, preferably having a thickness of 50 micron. In FIG. 2, the capacitors to the left of the radiation imaging device 206 represent the capacitance of the electrical insulation layer 220 and the storage capacitors 260.

In the radiation imaging system 200, the radiation emission device 205 is disposed above the radiation imaging device 206, in which the top electrode 210 is disposed at the top surface of the electrical insulation layer 220 and the charge collection electrode 230 as a pixel unit is disposed at the bottom surface of the electrical insulation layer 220. In one embodiment, pixel units are electrically coupled to the electrical insulation layer 220 and at least one transistor is connected to each pixel unit so that the pixel units are disposed at the bottom surface of the electrical insulation layer 220. Each transistor is coupled between one of the charge collection electrodes 230, disposed within the bottom surface of the electrical insulation layer 220, and a ground.

In another embodiment, a pixel unit may comprise the charge collection electrode 230, the storage capacitor 260, and the transistor 250. The charge collection electrode 230 collects a charge signal in a pixel area of the electrical insulation layer 220. The storage capacitor 260 is connected to the charge collection electrode 230 for storing the charge signal collected by the charge collection electrode 230. The field effect transistor (FET) 250 is connected to the charge collection electrode 230 and is acting as a switch between the storage capacitor 260 and the external charge integrating amplifier 240.

In a detector (also referred to as the radiation imaging system 200) according to embodiments of the invention, at the time when a charged particle transverses through the dielectric layer 220, the continuous ionization along its path creates a conductive channel to allow the current to conduct from the bias electrode 210 to the pixel electrode 230. This conductive channel is open only when the charged particle transverses the dielectric layer 220. In contrast, the photoelectric interaction of an x-ray or gamma ray photon with the dielectric layer 220 produces a group of electron-hole pairs localized at the point of interaction. Even with an electrical field between the bias electrode and the pixel electrode, the charge separation and mobility of the electron-hole pairs in the dielectric layer 220 is limited and therefore it requires multiple x-ray or gamma ray photons interacting at the nearby location in a pixel to produce a conductive path to allow current to flow from the bias electrode to the pixel electrode. In this detector 200 (or radiation imaging system 200), the detection of a single x-ray or gamma ray is low, but the detection of a charged particle is high. Therefore, the charged particle signal to the background photon noise ratio is high even in a high-background photon radiation environment.

Figure 3:
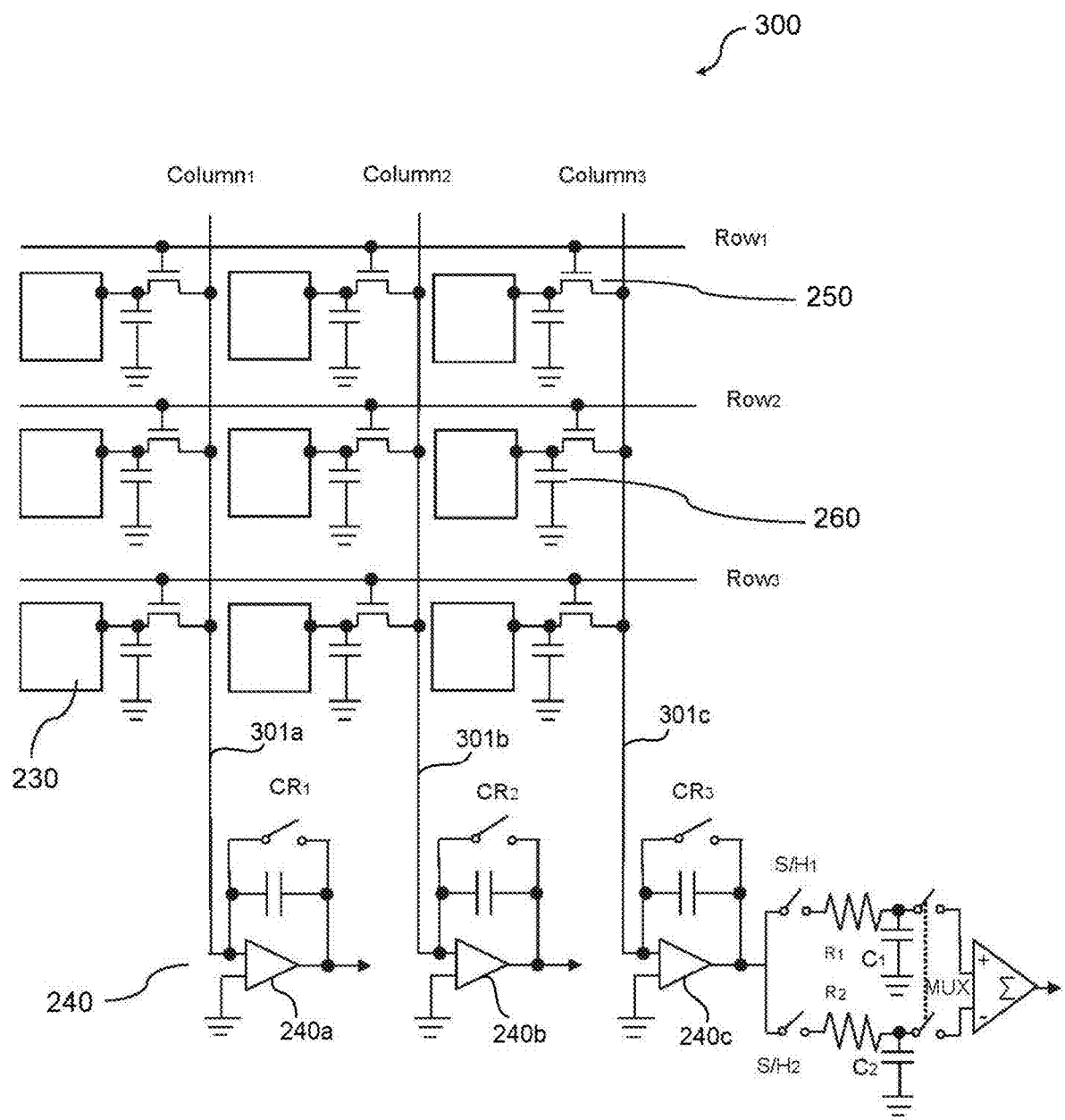
FIG. 3 illustrates a schematic diagram of a readout circuit, according to an embodiment of the present invention.

FIG. 3 illustrates a schematic diagram of a readout circuit 300, according to an embodiment of the present invention.

As shown in FIG. 3, the pixel matrix is arranged multiple rows and multiple columns, such as N rows by M columns. Although FIG. 3 illustrates an arrangement of three (3) rows by three (3) columns, other numbers of rows and columns may be utilized. The gate lines of each row of transistors are connected to each of a multiplicity of external gate drivers. A data line of each column of transistors, orthogonal to the gate lines, is connected to each of multiplicity of charge integrating amplifiers. Before the radiation beam exposure, a bias voltage with a magnitude up to, but not exceeding, the breakdown voltage of the electrical insulator is applied to the top electrode 210, and a negative voltage is applied to all the gate electrode of the pixel FET transistors. During the radiation beam exposure, the ionization channel current of the insulation layer 220 is increased proportional to the intensity or the dose of the radiation. The local ionization channel charge above each pixel is then stored in the storage capacitor 260.

During readout of the image resulting from the radiation beam exposure, the gate voltage in one row (Row1, Row2, or Row3) is turned from negative to positive allowing the charge stored in each pixel in that row to flow via the orthogonal data line 301a, 301b, 301c to the respective charge integrating amplifier 240a, 240b, 240c and subsequently digitized by the processing computer (not shown in FIG. 3). After the data of one row in the matrix is completed, the potential of the gate line in that row will return to negative, returning the FET transistor to an "off" state. The potential of the next row of gate lines will then turn from negative to positive allowing the stored charge to flow to the orthogonal charge integrating amplifiers. This process will repeat in turns until all the charges in the pixel matrix are read out.

In one embodiment, an array of pixel units is directly coupled to the electrical insulation layer 220 without any intervening layer for a radiation converter having a charge generation material (CGM), such as amorphous selenium, or without a photoconductive layer for converting X-ray energy to electron-hole pairs. Using a thin layer of electrical insulation material without a layer with selenium, the charge generation efficiency from photo-electric effect, an interaction of photon with insulation material, is typically 100 times less than the charge generation efficiency from the interaction of photon with selenium. However, upon the exposure to particle beam radiation, the charges passing through the ionization channel retain the high spatial resolution, while exhibiting orders of magnitude less charge trapping or alternation of local electric field affecting the subsequent images. The radiation imaging system 200 having the electrical insulation layer 220 and the charge collection electrode 230 within the electrical insulation layer 220 does not have a layer with selenium and does not have a layer on the electrical insulation layer 220 for blocking electrons.

In one embodiment according to the present invention, the radiation imaging system 200 is able to obtain images from a beam of particle radiation. When an energetic charged particle transverses through an insulator, it ionizes the neutral atoms in the insulating materials, resulting an ionization channel along its path. This ionization channel allows current to flow between the bias electrode to the pixel electrode with charges accumulating in the storage capacitor of the respective pixel. This ionization channel is closed upon the exit of the energetic charged particle from the insulator layer. The ionization of the insulating materials may be caused by various types of charged particle beam radiation including electron beam, proton beam, helium ion beam, carbon ion beam, heavy ion beam, muon beam, pion beam and etc.

In one embodiment according to the present invention, the radiation beam is high intensity X-ray beam, and a range of X-ray energy may be anywhere from about 5 keV to about 10 MeV. A conductive channel can be formed when the concentration of multiple x-ray photons in a pixel is sufficiently high to form a continuous path between the bias electrode and the pixel electrode. In particular, embodiments of the invention are able to generate high resolution images using high intensity x-rays with energy levels of greater than 50 keV (or 50 keV-10 MeV), which is beyond a range at which prior art devices are able to generate high-resolution images. In addition, embodiments of the invention are able to generate high resolution images using high intensity x-rays with energy levels of 100 keV or greater (or 100 keV-10 MeV), which is significantly beyond the range at which prior art devices are able to generate high-resolution images. However, any particular level of X-ray energy may be applied depending on a purpose of using the radiation imaging system 200 without departing from the scope of the present invention.

According to one embodiment, a range of radiation applied to the top electrode 210 is 50 milliroentgen per hour (mR/hr) or greater. In another embodiment, the range of radiation applied to the top electrode 210 is 100 mR/hr or greater. According to an embodiment, the electrical insulation layer 220 may have a thickness of about 0.1 micrometer or greater. According to the present specification and claims, the term "about 0.1 micrometer" means with a variation of 10% or less. However, any thickness of the electrical insulation layer 220 may be selected depending on a purpose of using the radiation imaging system 200 without departing from the scope of the present invention. According to one embodiment, the electrical insulation layer 220 has a thickness of 10 mm or less.

In one embodiment, the radiation imaging system 200 is a proton beam system, and an image is generated by directing a proton beam at the top electrode 210 of the radiation imaging system 200, and the electrical insulation layer 220 is sufficiently thin that the proton beam passes through the electrical insulation layer 220 to a patient after generating a charge in the radiation imaging system 200. In such an embodiment, a thickness of the electrical insulation layer may be at least about 0.1 micrometer.

In one embodiment, the electrical insulation layer 220 may be deposited on top of the charge collection electrode 230. The charge collection electrode 230 may be disposed at the bottom surface of the electrical insulation layer 220 opposite the top surface of the electrical insulation layer 220 where the top electrode 210 is attached. In another embodiment, the charge collection electrode 230 may be integrated in the electrical insulation layer 220 at the bottom surface of the electrical insulation layer 220 as shown in FIG. 2. In embodiments of the invention, the charge-collection electrode 230 is in direct contact with the electrical insulation layer 220, or in other words, no photoconductive layer is formed between the charge-collection electrode and the electrical insulation layer 220. In one embodiment, the top electrode 210 is formed directly on the top surface of the electrical insulation layer 220, to directly contact the top surface of the electrical insulation layer 220.

In one embodiment, the radiation imaging device 206 of the radiation imaging system 200 can be prepared beginning with a commercially available thin film transistor panel which comprises a substrate 270, the storage capacitors 260, the transistors 250, and the charge integrating amplifier 240. Commercially available panels used in liquid crystal displays may be a convenient starting point for building a thin film transistor panel. The charge collection electrode 230 may be formed on the thin film transistor panel. Over the surface of the charge collection electrode 230 there may be applied the electrical insulation layer 220. The electrical insulation layer 220 may be formed directly on the charge collection electrode 230. The electrical insulation layer 220 may also be formed directly on the thin film transistor panel. The top electrode 210 may be formed on the electrical insulation layer 220.

A scintillating light of conventional scintillation imaging detectors needs to travel a long distance of typically hundreds of microns before converting the light to electrical charge by means of photo diodes. Along this long optical path, the scintillation light of conventional scintillation imaging detectors may undergo scattering inside the scintillation material, resulting in image sharpness degradation.

On the other hand, a problem with conventional direct conversion photoconductive material, such as amorphous selenium, is that some of the electrical charges generated within the photoconductive layer may continue to reside as trapped charges not only within the photoconductive layer but also at planar interfaces between the surfaces of the photoconductive layer and adjacent layers. These residual electrical charges must be fully eliminated prior to the next X-ray exposure. Otherwise, a false image pattern related to the previous radiation pattern may be added to subsequent radiograms. In the radiation imaging system 200 of the present invention, electrical insulation material with no significant hysteretic charge movement is used with a novel structure or configuration of the top electrode 210, the electrical insulation layer 220, and the charge collection electrode 230, and thus, no residual charge-erasing scheme is required for imaging and high spatial resolution can be retained.

Figure 4:
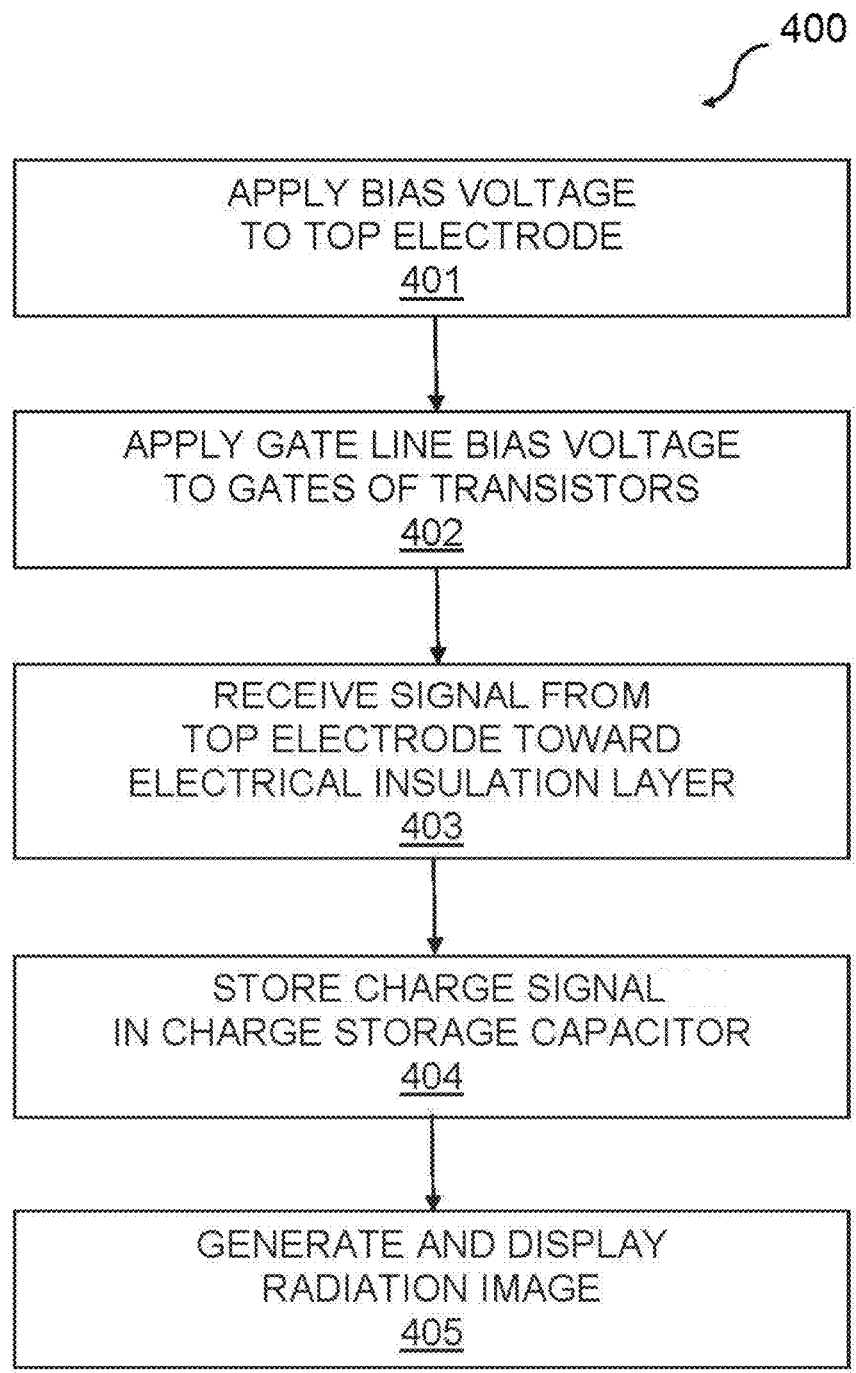
FIG. 4 illustrates a flowchart of a method for operating a radiation imaging system, according to an embodiment of the present invention.
Figure 6:
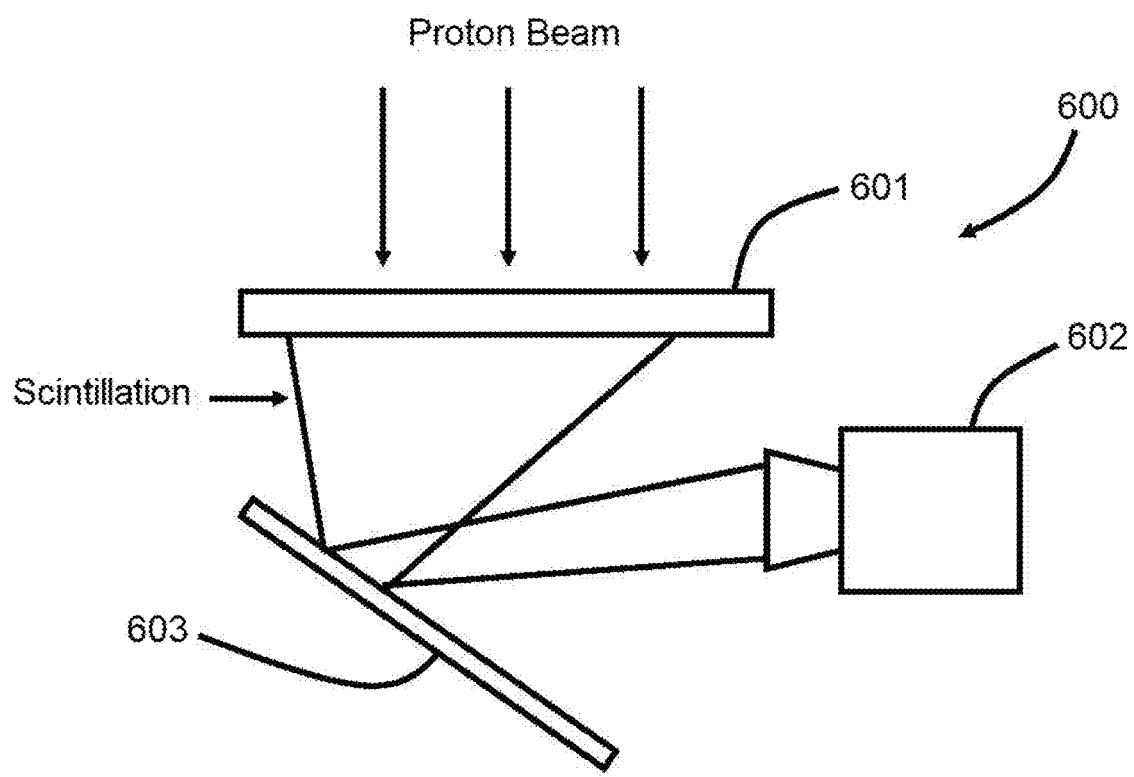
FIG. 6 shows a prior art device for detecting proton beam radiation in a proton beam therapy environment.

FIG. 4 illustrates a flowchart of a method 400 for operating a radiation imaging system 200, according to an embodiment of the present invention. The radiation imaging system includes a radiation image-generating device having an electrical insulation layer having a top surface and a bottom surface, a top electrode on the top surface of the electrical insulation layer, an array of pixel units electrically coupled to the electrical insulation layer, and an array of transistors connected to the array of pixel units. The method 400 may be performed and operated electronically using a Graphical User Interface (GUI) in a computer system. For example, a user may interact with a GUI of a computer system to generate commands to control a radiation-emission device to emit radiation, and to control the radiation image-generating device to generate charges required to output electrical signals based on the emitted radiation. The computer system may then convert the received signals into an image to be displayed on a display device or stored in electrical storage (memory).

An embodiment of a method in which the radiation imaging system 200 shown in FIG. 2 and FIG. 3 may be employed for acquiring an image with high spatial image resolution will now be described with respect to the following flow diagram of the method 400 depicted in FIG. 4. It should be apparent to those of ordinary skill in the art that the method 400 represents a generalized illustration and that other steps may be added, or existing steps may be removed, modified or rearranged without departing from the scope of the present invention. In addition, the method 400 is described with respect to the radiation imaging system 200 by way of example and not limitation, and the method 400 may be performed in other types of radiation imaging systems.

At step 401, a bias voltage with magnitude up to but not exceeding the breakdown voltage of the electrical insulation layer is applied to the top electrode 210 toward the electrical insulation layer 220.

At step 402, a gate line bias voltage is applied to gates of the transistors 250 to render each of the transistors 250 to be in an "off" state.

At step 403, radiation is emitted from a radiation-emission device 205 and a signal is received from the top electrode 210 toward the electrical insulation layer 220. Based on the received signal, a charged particle penetrates the electrical insulation layer 220 to generate a charge signal. In one embodiment, the radiation is a high intensity x-ray radiation and the photon is an x-ray photon. According to one embodiment, a voltage of the x-ray signal may be in a range from 5 KeV to about 10 MeV. According to one embodiment, a range of radiation applied to the top electrode 210 is 50 milliroentgen per hour (mR/hr) or greater. In another embodiment, the range of radiation applied to the top electrode 210 is 100 mR/hr or greater. According to another embodiment, the radiation is proton beam radiation, and the photon is generated based on the proton beam being directed at the top electrode 210. At step 403, the signal is collected at the array of pixel units. Each of the pixel units includes the charge collection electrode 230 disposed at the bottom surface of the electrical insulation layer 220 as depicted in FIG. 2. At step 403, the signal is collected within the electrical insulation layer 220.

At step 404, the charge signal is stored in a charge storage capacitor 260. The polarity of one row of the gate line bias voltage is changed to render all pixel transistors in the respective row to be in an "on" state. Further, the charges from the orthogonal data line is integrated and then the integrated charge is digitized as a value to be stored in the computer memory. The polarity of the gate line bias voltage is restored to render the respective row of transistor to be in the "off" state. The polarity of the next row of gate line bias voltage is changed to render all the pixel transistors in the next row to be in the "on" state. These steps may be repeated until all the charge signals stored in the array are read out and stored in the computer memory.

At step 405, a radiation image is generated based on the signal stored at the charge storage capacitor and the generated radiation image is displayed for a user. The radiation image may be electrically displayed via a computer monitor or on a film or a paper.

Figure 1:
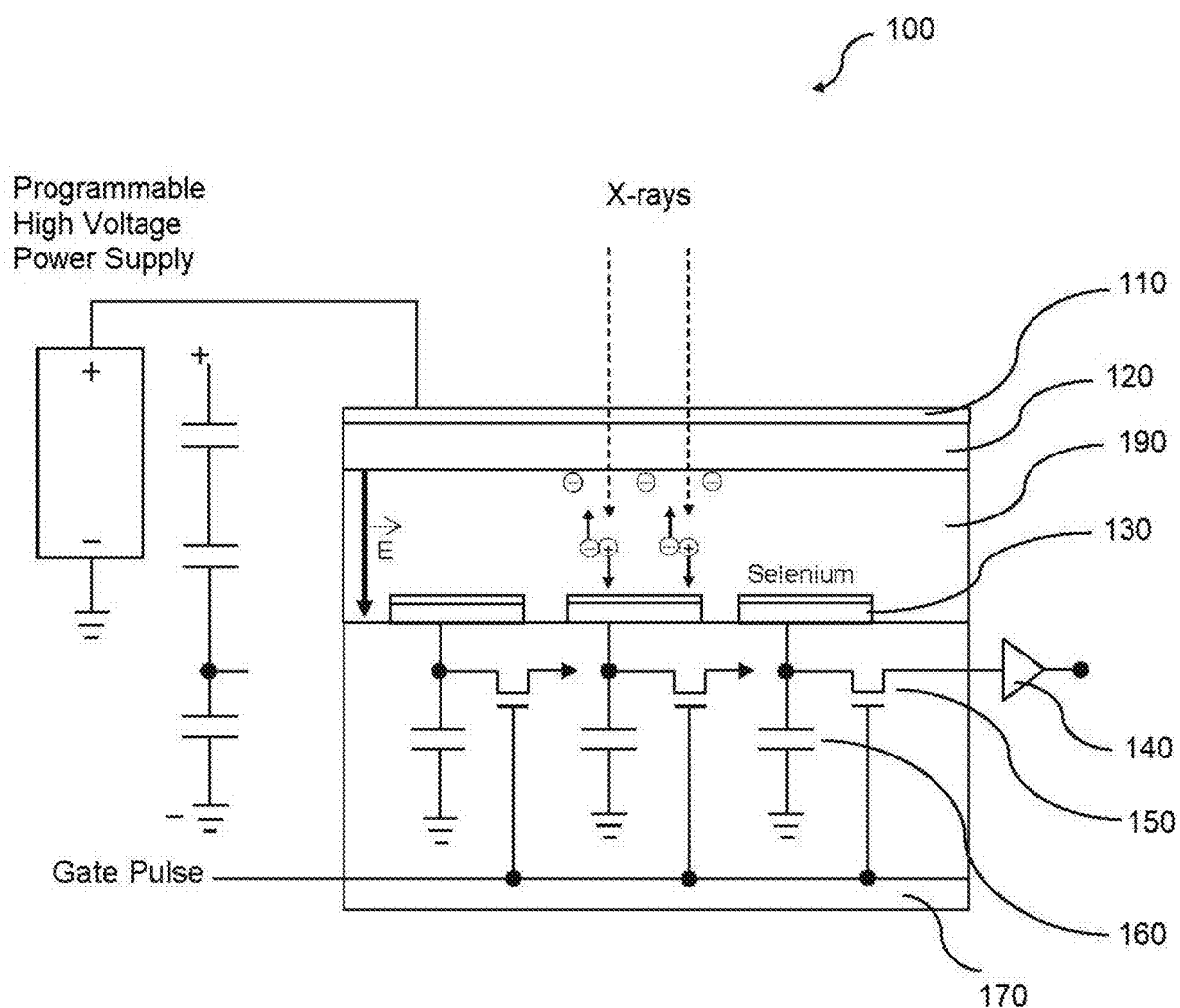
FIG. 1 illustrates a schematic view of a conventional radiation imaging system using a Direct Conversion Technology (DCT)

FIG. 5 shows comparison of x-ray images obtained from the radiation imaging system 200, according to an embodiment of the present invention, and x-ray images obtained from conventional radiation imaging systems. FIGS. 5(A) and 5(C) show x-ray images obtained from the radiation imaging system 200, according to an embodiment of the present invention. FIG. 5(B) shows an x-ray images obtained from an x-ray detector using an indirect conversion method. FIG. 5(D) shows an x-ray images obtained from an x-ray detector using a direct conversion method including a structure similar to that shown in FIG. 1, including the photoconductive layer 190. The x-ray image obtained from the radiation imaging system 200, according to an embodiment of the present invention shows superior image quality compared to the x-ray image obtained from an x-ray detector using the indirect conversion method. In addition, the x-ray image obtained from the radiation imaging system 200, according to an embodiment of the present invention shows better image quality or at least the same compared to the x-ray image obtained from an x-ray detector using the direct conversion method.

"Detective quantum efficiency" is the measure of how efficient a detection device is. The DQE for the radiation imaging system 200 is less than 10% for x-ray and gamma, requiring the use of high-energy x-rays to obtain imageable data. However, the DQE of the radiation imaging system 200 for proton beam radiation (charged particles) is very high—close to 100% (i.e. within a range of 98%-100%). One x-ray or gamma ray cannot produce a detectable imageable point. However, every single charged particle such as a proton, transverses through the insulating layer generates an image-able point in the radiation imaging system 200.

In addition, in proton therapy, a patient may be in a room with high background radiation (i.e. where there are significant background x-rays and gamma rays). Since the DQE of x- and gamma rays is low with the radiation imaging system 200, but the detection of charged particles is high, the accuracy of the radiation imaging system using a proton beam is high, even in a high-background-radiation environment. Consequently, according to one embodiment, the radiation imaging system is used to receive proton beams in a proton radiation therapy operation.

Figure 7:
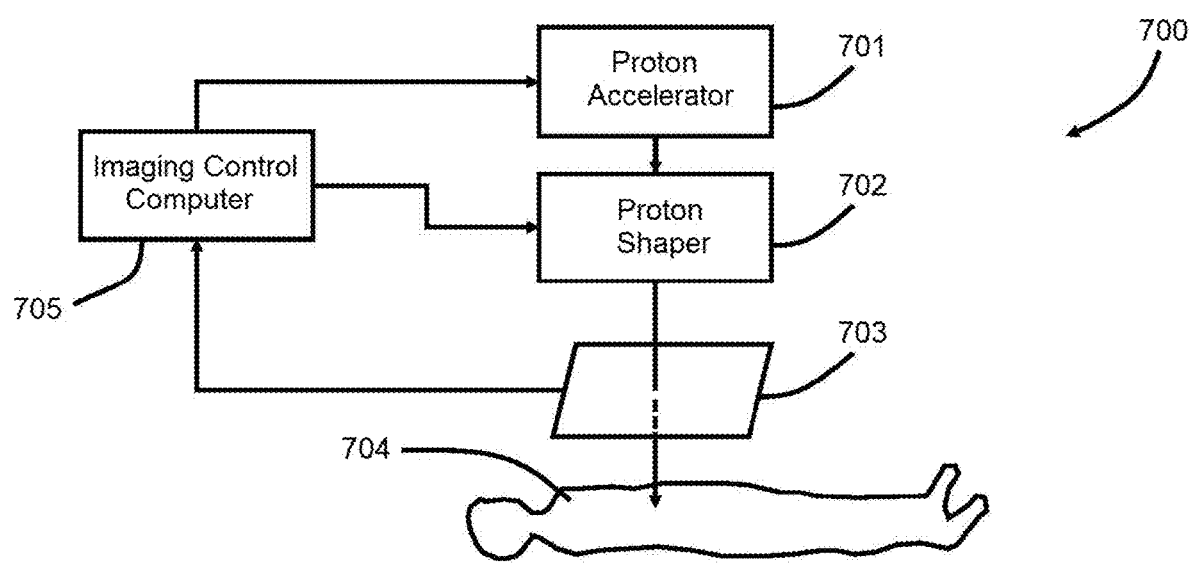
FIG. 7 is a proton beam radiation therapy system according to one embodiment.

FIG. 7 shows a radiation therapy system according to one embodiment. In particular, FIG. 7 shows a proton beam radiation therapy system 700. The system includes a proton accelerator 701, a proton shaper 702, and an imaging system 703.

In operation, proton particles are accelerated by the proton accelerator 701. The proton particles having been accelerated by the proton accelerator 701 pass through the proton shaper 702 to form a beam of a desired shape. For example, in an embodiment in which a tumor in a patient 704 is being treated, the proton shaper 702 may shape a beam of accelerated protons from the proton accelerator 701 to have a diameter corresponding to a diameter of (or within a predetermined size relative to) the tumor. The proton shaper 702 shapes the beam of accelerated protons using magnets, coils, collimators, etc.

The imaging system 703 corresponds to the radiation imaging system 200 of FIG. 2. According to embodiments of the invention, the electrical insulation layer 220 of the radiation imaging system 200 is sufficiently thin so as to allow the particle beam to pass through the imaging system 703 to reach the patient 704 where the proton beam terminates. In one embodiment, the electrical insulation layer 220 is at least about 0.1 micrometer.

In one embodiment, the system 700 includes an imaging control computer 705. The imaging control computer 705 may include control circuitry or may be programmed to control operation of the proton accelerator 701 and the proton shaper 702 to emit a proton beam of a particular shape through the imaging system 703 to the patient 704. The imaging control computer 705 may further receive signals from the imaging system 703 based on the proton beam passing through the imaging system 703 and may store and analyze data, and may generate an image, based on the received signals. In one embodiment, the imaging control computer 705 has stored therein position data of the patient 704 and maps location data of the proton beam to the position data of the patient 704 based on the received signals from the imaging system 703.

Figure 8:
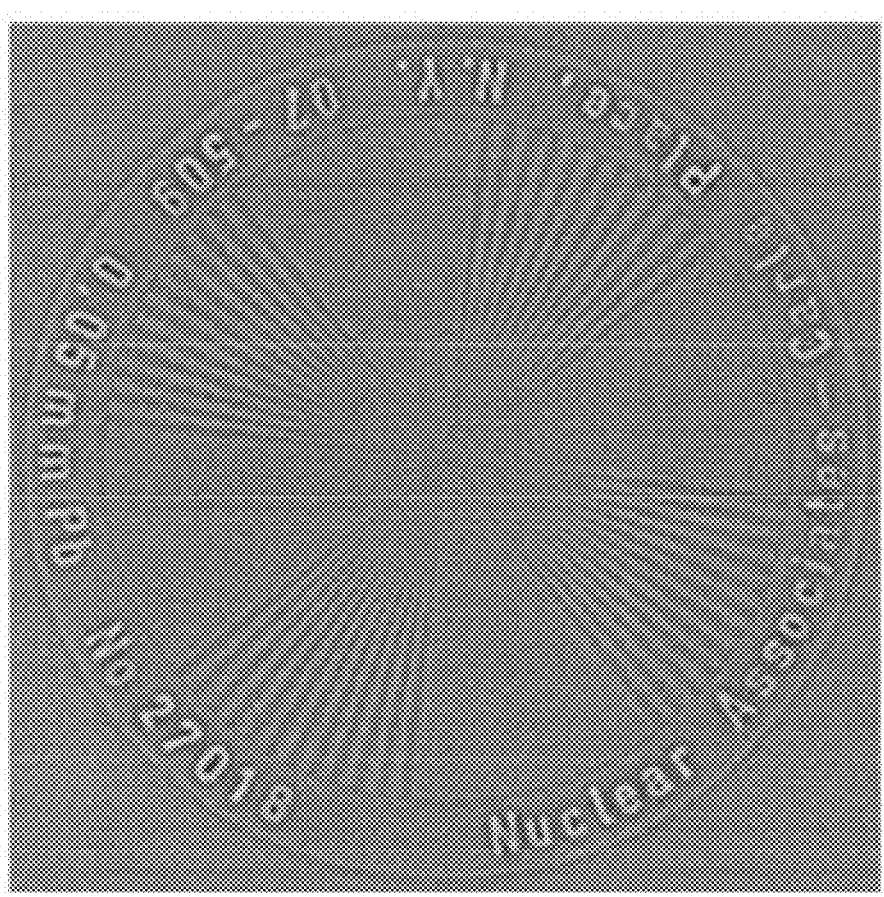
FIG. 8 is an image of a Star target obtained using a Spread Out Bragg Peak (SOBP) proton beam imaging system according to an embodiment of the present invention.

FIG. 8 is an image of a Star target in the place of the patient 704, using a 150 MeV SOBP (Spread Out Bragg Peak) proton beam from a proton accelerator 701, and an imaging system 703 according to embodiments of the present invention.

Figure 9:
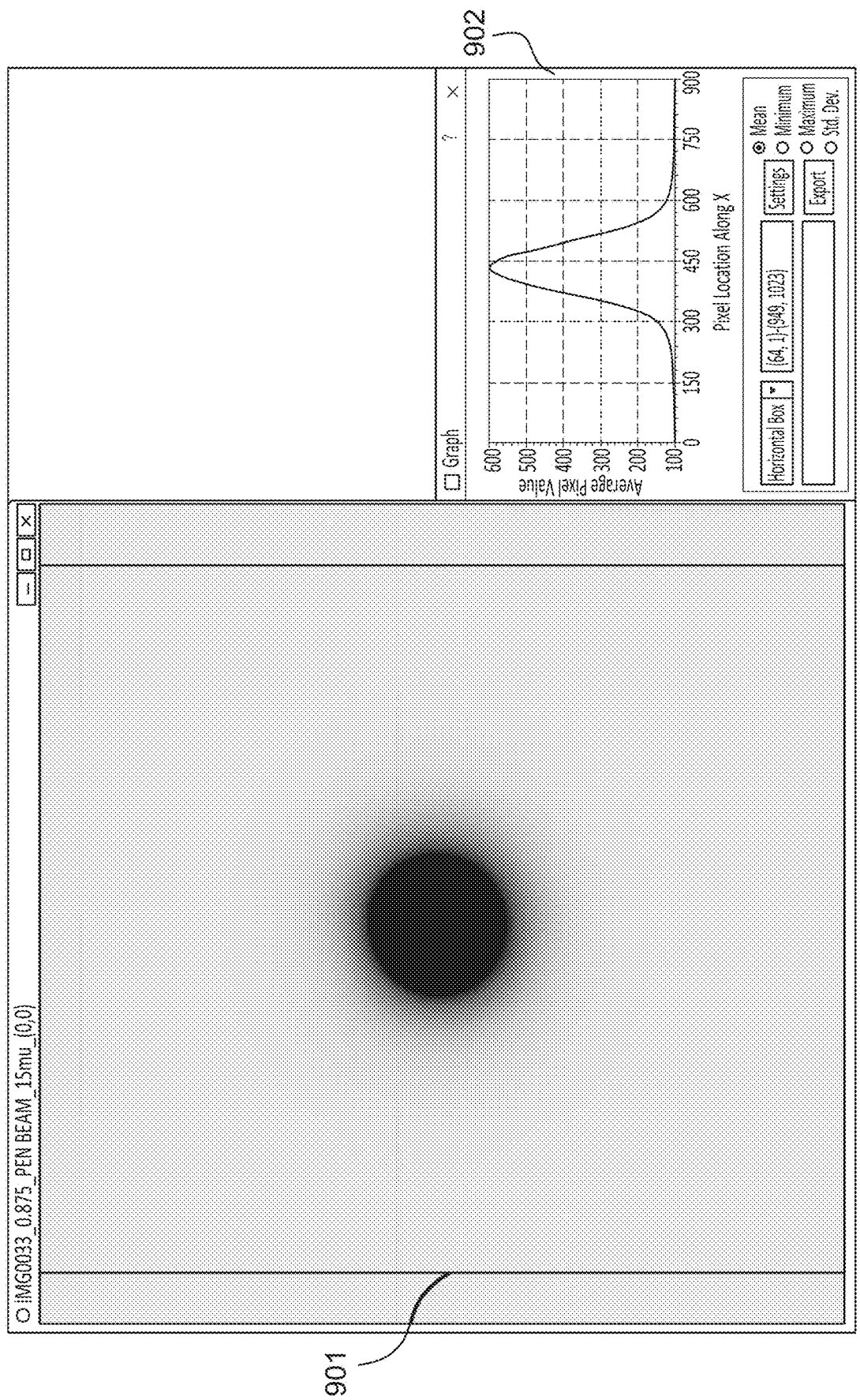
FIG. 9 is a graphical user interface (GUI) showing an image of a proton pencil beam obtained using a radiation imaging system of an embodiment of the present invention.

FIG. 9 is an example of a graphical user interface (GUI) used in an imaging control computer 705 according to an embodiment of the invention. The GUI includes an image 901 depicting a 150 MeV proton pencil beam generated based on signals output by the imaging system 703 and an intensity profile 902 of the proton pencil beam.

Figure 10:
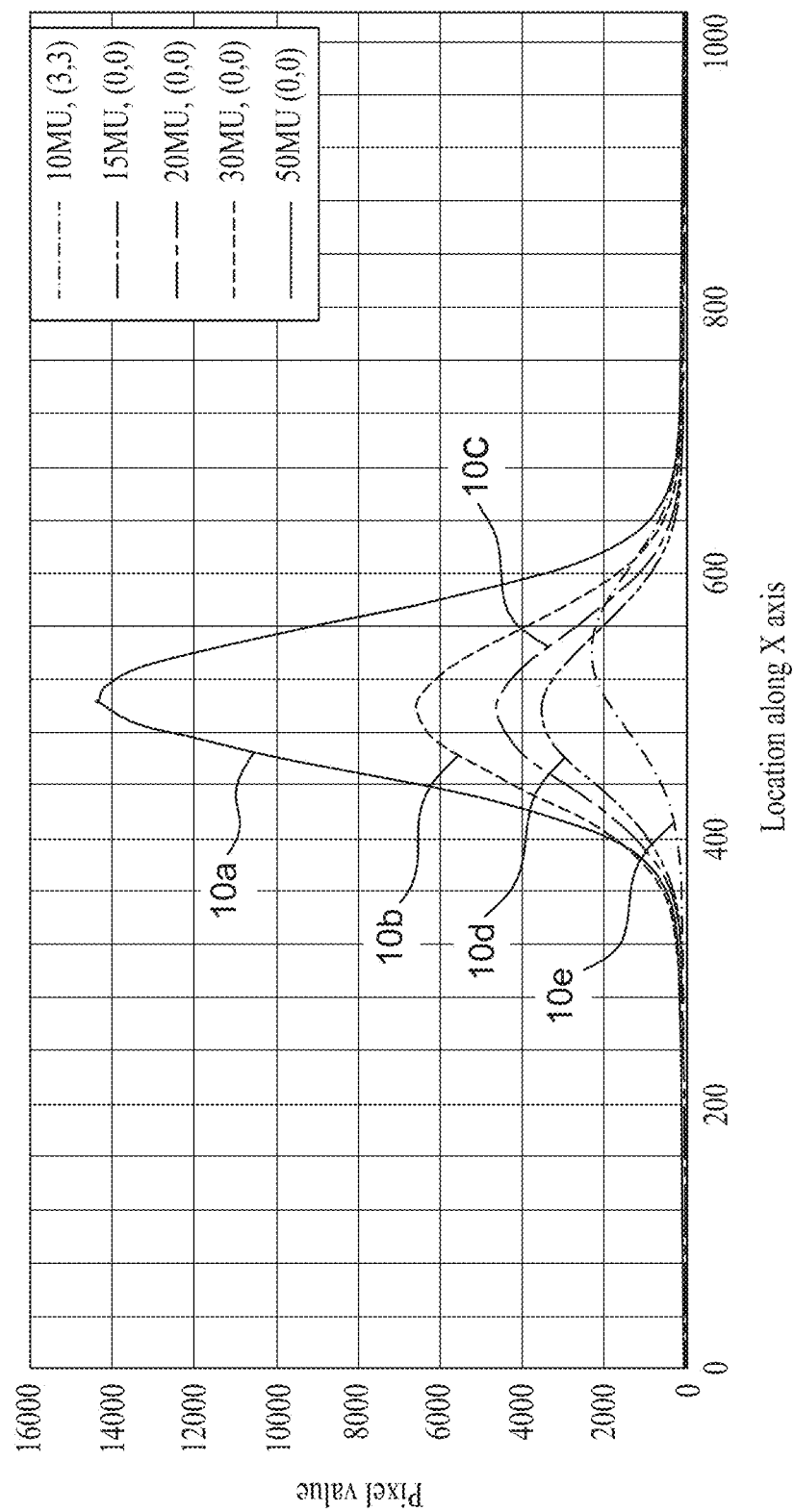
FIG. 10 is a graph showing the intensity of five proton pencil beams with various position coordinates and the beam intensity profiles measured with an imaging system according to an embodiment of the present invention.

FIG. 10 is a graph showing the intensity profile and positions of five proton pencil beams, 10a, 10b, 10c, 10d, and 10e, measured with the imaging system 703 according to embodiments of the present invention. As illustrated by FIG. 10, the imaging system 703 may output intensity and position data, along an x axis and y axis (only x axis is shown in FIG. 10), to be displayed as a graph by the imaging control computer 705.

Although described specifically throughout the entirety of the instant disclosure, representative embodiments of the present invention have utility over a wide range of applications, and the above discussion is not intended and should not be construed to be limiting, but is offered as an illustrative discussion of aspects of the invention.

What has been described and illustrated herein are embodiments of the invention along with some of their variations. The terms, descriptions and figures used herein are set forth by way of illustration only and are not meant as limitations. Those skilled in the art will recognize that many variations are possible within the spirit and scope of the invention, wherein the invention is intended to be defined by the following claims and their equivalents in which all terms are mean in their broadest reasonable sense unless otherwise indicated.

What is claimed is:

1. A radiation imaging device comprising:
   an electrical insulation layer having a top surface and a bottom surface;
   a top electrode on the top surface of the electrical insulation layer; and
   a plurality of pixel units electrically coupled to the electrical insulation layer and in direct contact with the bottom surface of the electrical insulation layer,
   wherein when a bias voltage is applied to the top electrode and a radiation beam is directed at the top electrode, the electrical insulation layer is ionized, generating a charge signal in one or more of the plurality of pixel units, and
   wherein the electrical insulation layer includes no photo-conductive layer.

2. The radiation imaging device as claimed in claim 1, wherein each of the plurality of pixel units comprises a charge collection electrode.

3. The radiation imaging device as claimed in claim 2, wherein the charge collection electrode is disposed at the bottom surface of the electrical insulation layer within the electrical insulation layer.

4. The radiation imaging device as claimed in claim 2, wherein each of the plurality of pixel units further comprises a charge storage capacitor and at least one transistor.

5. The radiation imaging device as claimed in claim 4, wherein the plurality of pixel units is disposed at the bottom surface of the electrical insulation layer.

6. The radiation imaging device as claimed in claim 4, wherein the transistor is coupled between the charge collection electrode and a charge integrating amplifier.

7. The radiation imaging device as claimed in claim 1, wherein a thickness of the electrical insulation layer is at least 0.1 micrometer.

8. The radiation imaging device as claimed in claim 1, wherein the plurality of pixel units is electrically coupled to the electrical insulation layer.

9. A radiation imaging system, comprising:
   a radiation-emission device; and
   a radiation imaging device configured to receive radiation from the radiation-emission device and generate an image based on the radiation, the radiation imaging device, comprising:
      an electrical insulation layer having a top surface and a bottom surface;
      a top electrode on the top surface of the electrical insulation layer; and
      a plurality of pixel units electrically coupled to the electrical insulation layer and in direct contact with the bottom surface of the electrical insulation layer,
      wherein when a bias voltage is applied to the top electrode and a radiation beam from the radiation-emission device is directed at the top electrode, the electrical insulation layer is ionized, generating a charge signal in one or more of the plurality of pixel units, and
      wherein the electrical insulation layer includes no photoconductive layer.

10. The radiation imaging system of claim 9, wherein each of the plurality of pixel units comprises a charge collection electrode, and
   wherein the charge collection electrode is disposed at the bottom surface of the electrical insulation layer within the electrical insulation layer.

11. The radiation imaging system of claim 9, wherein the electrical insulation layer is made of one of parylene, BCB (Benzocyclobutene), and polyimide film (KAPTON).

12. The radiation imaging system of claim 9, wherein the radiation emission device is an x-ray emitter.

13. The radiation imaging system of claim 9, wherein the radiation emission device is a charged particle beam emitter.

14. The radiation imaging system of claim 13, wherein the charged particle beam emitter is a proton beam emitter.

15. The radiation imaging system of claim 14, wherein the radiation imaging device is arranged between the charged particle beam emitter and a patient, such that a proton beam is irradiated against the patient after passing through the radiation imaging device.

16. The radiation imaging system of claim 14, wherein a thickness of the electrical insulation layer is at least about 0.1 micrometers.

17. A method of operating a radiation imaging system comprising an electrical insulation layer having a top surface and a bottom surface, a top electrode on the top surface of the electrical insulation layer, a plurality of pixel units electrically coupled to the electrical insulation layer and in direct contact with the bottom surface of the electrical insulation layer, and a transistor connected to each of the plurality of pixel units, the method comprising:

(1) applying a bias voltage to the top electrode;
(2) receiving a charged particle generated based on a radiation beam being directed at the top electrode to which the bias voltage is applied, wherein the charged particle penetrates the electrical insulation layer and generates a charge signal;
(3) storing the charge signal in a storage capacitor, such that a plurality of charge signals is stored in a plurality of storage capacitors;
(4) changing a polarity of a gate line bias voltage of one row of transistors; and
(5) integrating charges from orthogonal data lines, each connected to a respective storage capacitor among the plurality of storage capacitors.

18. The method of claim 17, wherein the step (5) further comprises digitizing the integrated charges as a value and storing the value to a computer memory.

19. The method of claim 18, wherein the method further comprises
(6) restoring the polarity of the gate line bias voltage to render the one row of the transistors to be in "off" states.

20. The method of claim 19, wherein the method further comprises
(7) changing the polarity of a next row of the gate line bias voltage to render the transistors in the next row to be in "on" states.

21. The method of claim 20, wherein a plurality of charge signals is generated by a plurality of charged particles the plurality of charge signals stored in the plurality of storage capacitors, and wherein the method further comprises
(8) repeating the steps of (5), (6), and (7) until each charge signal is read out and stored in the computer memory.

22. The method of claim 17, wherein the bias voltage has a magnitude no greater than a breakdown voltage of the electrical insulation layer.

23. The method of claim 17, wherein the radiation beam is a beam of x-rays.

24. The method of claim 23, wherein the method further comprises, before receiving the charge signal from the top electrode toward the electrical insulation layer, applying the gate line bias voltage to gates of the transistors.

25. The method of claim 24, wherein the gate line bias voltage is applied to the gates of the transistors to render the transistors to be in "off" states.

26. The method of claim 25, wherein, in step (4), the polarity of the gate line bias voltage of one row of the transistors is changed to render all transistors in the one row to be in "on" states.

27. The method of claim 17, wherein the radiation beam is a proton beam.

28. The method of claim 27, further comprising irradiating a patient with the proton beam after the beam passes through the radiation imaging system.

29. The method of claim 27, wherein electrical insulation layer is at least about 0.1 micrometer, and wherein the proton beam penetrates and passes through the electrical insulation layer.

30. The method of claim 17, wherein the radiation beam is one of an electron beam, helium ion beam, carbon ion beam, heavy ion beam, muon beam, and a pion beam.

* * * * *